United States Patent
Karnaushenko et al.

(10) Patent No.: US 11,467,226 B2
(45) Date of Patent: Oct. 11, 2022

(54) METHOD FOR PRODUCING AT LEAST ONE THREE-DIMENSIONAL COMPONENT FOR THE UNI-, BI-, TRI- OR MULTI-DIRECTIONAL MEASUREMENT AND/OR GENERATION OF VECTOR FIELDS AND THREE-DIMENSIONAL COMPONENT FOR THE UNI-, BI-, TRI- OR MULTI-DIRECTIONAL MEASUREMENT AND/OR GENERATION OF VECTOR FIELDS

(71) Applicant: LEIBNIZ-INSTITUT FUER FESTKOERPER-UND WERKSTOFFFORSCHUNG DRESDEN E.V., Dresden (DE)

(72) Inventors: Daniil Karnaushenko, Dresden (DE); Dimitriy Karnaushenko, Dresden (DE); Oliver G. Schmidt, Dresden (DE)

(73) Assignee: LEIBNIZ-INSTITUT FÜR FESTKÖRPER-UND WERKSTOFFFORSCHUNG DRESDEN E.V., Dresden (DE)

( * ) Notice: Subject to any disclaimer, the term of this patent is extended or adjusted under 35 U.S.C. 154(b) by 708 days.

(21) Appl. No.: 16/341,813

(22) PCT Filed: Oct. 4, 2017

(86) PCT No.: PCT/EP2017/075200
§ 371 (c)(1),
(2) Date: Oct. 11, 2019

(87) PCT Pub. No.: WO2018/069112
PCT Pub. Date: Apr. 19, 2018

(65) Prior Publication Data
US 2020/0025839 A1    Jan. 23, 2020

(30) Foreign Application Priority Data

Oct. 13, 2016   (DE) .................... 10 2016 220 024.0

(51) Int. Cl.
*G01R 33/00*    (2006.01)
*G01R 33/07*    (2006.01)
(Continued)

(52) U.S. Cl.
CPC ........ *G01R 33/0052* (2013.01); *B81C 1/0019* (2013.01); *B81C 1/00373* (2013.01);
(Continued)

(58) Field of Classification Search
CPC ................... G01R 33/0052; G01R 33/072; G01R 33/091; B81C 1/0019; B81C 1/00373; B81C 1/00476
See application file for complete search history.

(56) References Cited

U.S. PATENT DOCUMENTS

| 8,136,213 B2 | 3/2012 | Schmidt |
| 8,786,378 B2 | 7/2014 | Kroenin |

(Continued)

FOREIGN PATENT DOCUMENTS

| DE | 101 59 415 | 6/2003 |
| DE | 10 2009 027 746 | 9/2010 |

(Continued)

OTHER PUBLICATIONS

Karnaushenko et al., "Biomimetic Microelectronics for Regenerative Neuronal Cuff Implants," Advanced Materials 27, pp. 6582-6589, 2015.
(Continued)

*Primary Examiner* — Reena Aurora
(74) *Attorney, Agent, or Firm* — Greenblum & Bernstein, P.L.C.

(57) ABSTRACT

The invention concerns the field of microelectronics and relates to a three-dimensional component which, for example as a sensor, measures the direction of a property in a vector field. The object of the present solution is to specify a three-dimensional component that is capable of measuring and/or generating vector fields in multiple directions and/or simultaneously with low space requirements. The object is attained with a three-dimensional component for the uni-, bi-, tri- or multi-directional measurement and/or generation of vector fields, in which component at least one element made of material systems in present on a three-dimensional carrier made of at least one carrier material, which element measures and/or generates at least one vector field in at least one direction in the spatial position of the element on, against and/or in the carrier.

19 Claims, 2 Drawing Sheets

(51) Int. Cl.
*G01R 33/09* (2006.01)
*B81C 1/00* (2006.01)
(52) U.S. Cl.
CPC ........ *B81C 1/00476* (2013.01); *G01R 33/072* (2013.01); *G01R 33/091* (2013.01)

(56) References Cited

U.S. PATENT DOCUMENTS

| | | |
|---|---|---|
| 2005/0118733 A1 | 6/2005 | Schmidt et al. |
| 2014/0030553 A1 | 1/2014 | Makarov et al. |
| 2014/0103486 A1 | 4/2014 | Li et al. |
| 2014/0104030 A1 | 4/2014 | Li et al. |
| 2014/0234977 A1 | 8/2014 | Grimm et al. |
| 2014/0246764 A1 | 9/2014 | Li et al. |
| 2015/0137930 A1 | 5/2015 | Li et al. |
| 2017/0362080 A1 | 12/2017 | Grimm et al. |
| 2018/0075956 A1* | 3/2018 | Li .................. H01F 17/0006 |
| 2019/0062154 A1* | 2/2019 | Karnaushenko ...... B81C 1/0019 |
| 2020/0166587 A1* | 5/2020 | Uemura ................ H01L 43/04 |
| 2020/0300938 A1* | 9/2020 | Schmitt ................ G01R 33/093 |

FOREIGN PATENT DOCUMENTS

| | | |
|---|---|---|
| DE | 10 2011 005452 | 9/2012 |
| DE | 10 2012 221932 | 6/2014 |
| DE | 10 2014 223873 | 2/2016 |
| DE | 10 2015 219696 | 4/2016 |
| EP | 2 023 357 | 2/2009 |

OTHER PUBLICATIONS

Karnaushenko et al., "Compact helical antenna for smart implant applications," NPG Asia Materials 7, e188, 2015.

Mendach et al., "Preparation of curved two-dimensional electron systems in InGaAs/GaAs-microtubes," Physica E: Low-dimensional Systems and Nanostructures, Bd. 23, Nr. 3-4, pp. 274-279, Jul. 2004.

Cavallo et al.,"Controlled fabrication of Cr/Si and Cr/SiGe tubes tethered to insulator substrates" J.Appl.Phys,103.116103 2008.

Yi, "Force Control for Magnetic Levitation System using Flux Density Measurement," Proceedings of the 34th Conference on Decision and Control, New Orleans., pp. 871-876, 1995.

Nerguizian et al., "European Micro and Nano Systems" EMN, Paris ISBN: 2-84813-037-7, 2004.

Wouters et al., "Design and fabrication of an innovative three-axis Hall sensor," Sensors and Actuators A 237, pp. 62-71 (2016).

Official Communication issued in International Bureau of WIPO Patent Application No. PCT/EP2017/075200, dated Jan. 22, 2018, along with an English translation thereof.

Bleuler et al., "New Concepts for Cost-effective Magnetic Bearing Control," Automatica vol. 30, No. 5, S871-876 (1994).

* cited by examiner

METHOD FOR PRODUCING AT LEAST ONE THREE-DIMENSIONAL COMPONENT FOR THE UNI-, BI-, TRI- OR MULTI-DIRECTIONAL MEASUREMENT AND/OR GENERATION OF VECTOR FIELDS AND THREE-DIMENSIONAL COMPONENT FOR THE UNI-, BI-, TRI- OR MULTI-DIRECTIONAL MEASUREMENT AND/OR GENERATION OF VECTOR FIELDS

BACKGROUND

1. Field of the Invention

The invention concerns the fields of electrical engineering, microelectronics, materials engineering and mechanical engineering and relates to a three-dimensional component for the uni-, bi-, tri- or multi-directional measurement and/or generation of vector fields, which component, for example as a sensor, capacitor, resistor or source, measures at least the direction of a property in a vector field, such as magnetic or electromagnetic variables, pressure and tensile loads, mechanical stress, temperature or field gradients, for example, or generates a vector field, and relates to a method for the production of the component.

2. Description of the Background

Components with different electrical, electronic, thermal, mechanical and/or magnetic properties that are influenced, for example, by the direction, the magnitude and/or the gradient of magnetic, electromagnetic, mechanical or temperature variables, can be found in virtually all electrical and electronic devices, Such components can be capacitors, sensors, actuators, energy storage components, and the like.

Because components of this type are in particular integrated into electronic circuits in electronic or electrical devices, a simplest and most economical possible production of these components and a small footprint within the devices is of great importance so that the functional density of such circuits can be further increased.

To achieve a simplest and most cost-effective possible production with a small footprint for components in electronic circuits, the components can, for example, be mechanically self-assembled in 3D geometries, for example, rolled up.

In roll-up technology, layers are applied on a substrate, which layers subsequently roll up on their own in a controlled detachment from the substrate. The mechanism of the independent rolling-up is triggered, for example, by an application of the layers in a strained state and a subsequent mechanical relaxation, for example, by detaching the layers from the substrate. The independent rolling-up of strained thin-layer capacitors when these capacitors are detached from a substrate is known according to EP 2 023 357 B1.

Self-rolling GMI sensors are integrated on chips according to D. Karnaushenko et al.: Advanced Materials 27, p. 6582-6589, 2015. The one or more self-rolling GMI sensors are essentially composed of a rolled-up layer stack of a material system for GMI sensors and electrical contacts, and are produced by means of roll-up technology.

Rolled-up helical antennas for use in implantology are known according to D. Karnaushenko et al.: Asia Materials 7, e188, 2015.

Instead of the rolling-up into a cylinder shape in roll-up technology, other shapes can be achieved with independent self-assembly.

Likewise, the production of rolled resistors (F. Cavallo, et al: Applied Physics Letters, Vol. 93, No. 14, p. 143113-143113-3, October 2008) or the production of wound thermoelectric components (DE 2008 10 040 472. A1) are known.

According to S. Mendach, et al: Physica E: Low-dimensional Systems and Nanostructures, Vol. 23, No. 3-4, p. 274-279, July 2004, the production of curved two-dimensional electronic systems in InGaAs/GaAs microtubes is known.

Furthermore, various studies for the use of rigid Hall sensors in rotating (Bleuler et al., Automatica Vol. 30 No. 5, p. 871-876) and non-rotating (Yi et al., Proceedings of the 34th Conference on Decision and Control, New Orleans 1995) applications are known.

For the flux-based closed loop control of asynchronous motors, the use of micro electromechanical systems (MEMS) was also proposed (Nerguizian et al., European Micro and Nano Systems, EMN 2004, Paris ISBN: 2-84813-037-7).

A three-axis Hall sensor was proposed by Wouters et al: Sensors and Actuators A 237 (2016) 62-71 with which all three components of a magnetic field can be measured simultaneously with high precision. For this purpose, three uniaxial Hall sensors are assembled into the three-axis Hall sensor to form a cube. The assembly of the individual sensors occurs such that the measuring direction of each sensor corresponds to one component each of the magnetic field, and the measurement of the three orthogonally arranged components of the magnetic field can therefore be performed simultaneously in all three spatial directions.

Likewise, 3D Hall sensors are known in which lateral and vertical Hall elements are positioned together on a chip so that the three-dimensional vector of the magnetic flux density can then be measured. For this purpose, multiple Hall elements are used per direction and are arranged in point symmetry around a center point. The 3D Hall sensor can thus essentially measure in a punctiform manner (Wikipedia, German-language keyword "Hall-Sensor").

Furthermore, from U.S. Pat. No. 8,786,378 B2, a three-dimensional magnetic field sensor and a method for the production thereof are known, in which three MR elements are arranged on a planar substrate, wherein one MR element exhibits magnetization in the X direction, one MR element exhibits magnetization in the Y direction, and one MR element exhibits the magnetization in the Z direction.

A disadvantage of the solutions from the prior art is that the known components for the measurement and/or generation of vector fields can only ever measure or generate a vector field in individual directions, and that a high number of components with high space requirements is therefore necessary; or that, in the few known cases of a 3D design of such components for the measurement and/or generation of vector fields, the components can only be produced in a complicated manner with special technologies and, even then, the measuring and generating devices in a vector field are only limited to the respective direction of the individual sensors in the assembled 3D component.

SUMMARY

The object of the present invention is to specify a three-dimensional component for the uni-, bi-, tri- or multi-directional measurement and/or generation of vector fields, which component is capable of measuring and/or generating vector fields in multiple directions and/or simultaneously with low space requirements, and the specification of a simple and cost-effective method for the production of a component of this type.

The object is attained with the features recited in the patent claims, wherein the invention also includes combinations of the individual dependent patent claims within the meaning of a logical AND operation, provided that they are not mutually exclusive.

In the method according to the invention for producing at least one three-dimensional component for the uni-, bi-, tri- or multi-directional measurement and/or generation of vector fields:
  at least one sacrificial and/or adhesive layer is applied to a substrate, and
  at least one layer of a carrier material is applied thereon, and thereon at least one or more layers of material systems for one or more elements for the measurement and/or generation of vector fields in at least one direction are completely or partially applied, and layers of electrically conductive material for electrical contacts of the elements) are applied,
  wherein the individual layers are applied completely or partially across the entire surface, and
  the sacrificial and/or adhesive layer is subsequently at least partially removed from the substrate or modified for detachment from the substrate, and
  additional method steps can be carried out.

Advantageously, the layers are applied by means of lithographic methods and/or printing methods.

Also advantageously, at least one or more layers of material systems for one or more elements for the measurement and/or generation of vector fields in at least two or three or more directions are applied, and layers of electrically conductive material for electrical contacts of the element(s) are applied.

Likewise advantageously, a substrate of semiconducting materials, glass, metal, metal compounds, organic metal complexes, Si, Si wafers, polymers or flexible and/or stretchable materials are used.

Further advantageously, a sacrificial layer and/or adhesive layer of metal, metal compounds, organic metal complexes, ceramic, semiconducting materials and/or polymers are used.

And also advantageously, a carrier material of metal, metal compounds, organic metal complexes, ceramic, semiconducting materials and/or polymers is used.

Also advantageously, multiple layers of carrier material are used, wherein a layer can advantageously be composed of a swellable layer that can be completely or partially positioned on the sacrificial and/or adhesive layer.

It is also advantageous if layers of material systems for contacts, Hall sensors, GMR sensors, TMR sensors, AMR sensors, MR sensors, MI sensors, GMI sensors, spin valves, magnetic coils, antennas, optical sensors and/or sources, mechanical tension and/or pressure sensors, thermal sensors, acoustic sensors, capacitors, transistors, diodes and/or resistors are applied as elements.

It is further advantageous if, from the layer(s) of the carrier material, a three-dimensional carrier produced in a helical, tubular (cylindrical), elliptical, hyperbolic, toroidal, wave-like or shape, which carrier forms with the other layers applied thereon the three-dimensional In the three-dimensional component according to the invention for the uni-, bi-, tri- or multi-directional measurement and/or generation of vector fields:
  at least one element made of material systems is present on a three-dimensional carrier made of at least one carrier material,
  which element measures and/or generates at least one vector field in at least one direction in the spatial position of the element on, against and/or in the carrier.

Metal, metal compounds, organic metal complexes, ceramic, semiconducting materials and/or polymers are advantageously present as carrier material.

Likewise advantageously, the three-dimensional carrier is present in a helical, tubular, elliptical, hyperbolic, toroidal, wave-like or polygonal shape and, with the other elements located thereon, thereagainst and/or therein, forms the three-dimensional component.

Further advantageously, conductor tracks or layers of at least partially electrically conductive material, such as metals, conductive polymers, semiconductors or oxides, are present as contacts.

It is also advantageous if the element or elements are in a position against, on and/or in the carrier that is different from the production position.

It is furthermore advantageous if contacts, Hall sensors, GMR sensors, TMR sensors, AMR sensors, MR sensors, MI sensors, GMI sensors, spin valves, magnetic coils, antennas, optical sensors and/or sources, mechanical tension and/or pressure sensors, thermal sensors, acoustic sensors, magnets, capacitors, transistors, diodes and/or resistors are present as elements.

It is likewise advantageous if at least three elements are arranged against, on and/or in the carrier, wherein the measuring and/or generating directions of the elements are arranged differently than 90° to one another.

It is also advantageous if at least two elements are arranged against, on and/or in the carrier, wherein the measuring and/or generating directions of the elements are differently arranged relative to one another.

And it is also advantageous if the component has dimensions on the millimeter, micrometer and/or nanometer scale.

And also advantageously, the carrier has a width of at least 0.1 mm and a length of at least 0.1 mm and a wall thickness of at least 1 μm.

BRIEF DESCRIPTION OF THE DRAWING

The invention is described in greater detail iii the following, with FIGS. 1 and 2 depicting exemplary schematic illustrations of embodiments of details relating to the invention and in a non-limiting manner, whereby.

DETAILED DESCRIPTION

Figure 1:
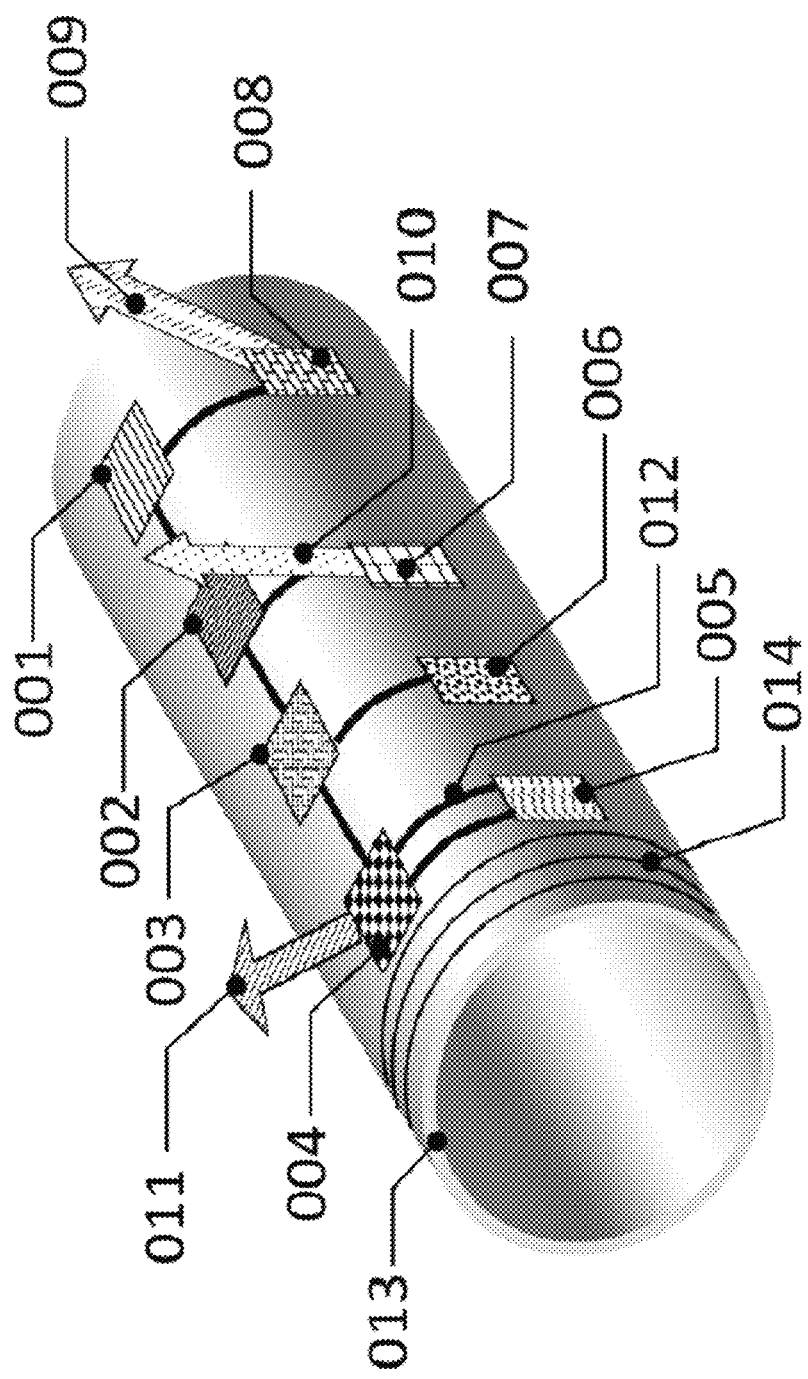
FIG. 1 illustrates a three-dimensional carrier, taking a tubular/cylindrical shape, on which different components of material systems have been applied.
Figure 2:
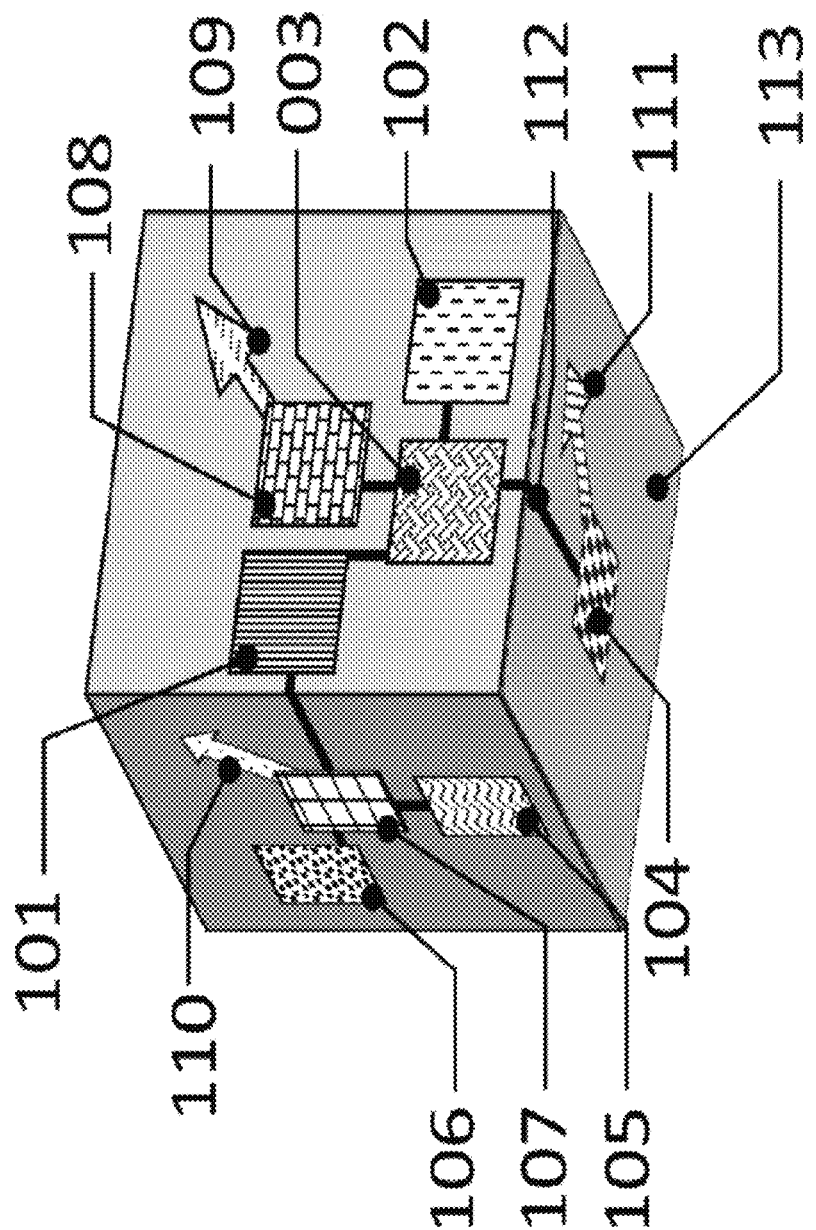
FIG. 2 illustrates a three-dimensional carrier, taking a polygonal shape, on which different components of material systems have been applied.

With the present invention, it becomes possible for the first time to specify a three-dimensional component for the uni-, bi-, tri- or multi-directional measurement and/or generation in vector fields, schematically shown by 009, 010, 011 (FIG. 1) and by 109, 110, 111 (FIG. 2, which component is capable of measuring and/or generating vector fields in multiple directions and/or simultaneously with low space requirements, and to specify a simple and cost-effective method for the production of a component of this type.

This is achieved with the method according to the invention, in which at least one sacrificial and/or adhesive layer is applied on a substrate.

Advantageously semiconducting materials, glass, metal, metal compounds, organic metal complexes, substrates made of Si, silicon dioxide, Si wafers, polymers or flexible and/or stretchable materials are used as a substrate.

The sacrificial and/or adhesive layer can be composed of metal, metallic compounds, organic metal complexes, ceramic, semiconducting materials and/or polymers.

During the application of the layer or layer stack, the sacrificial and/or adhesive layers are themselves not strained or modified. However, the layer or layer stack can be applied on the sacrificial and/or adhesive layer in a strained state, so that the layer or layer stack relaxes during the partial or complete removal of the sacrificial layer and/or during the modification of the adhesive layer and changes its shape, for example, rolls up. It is, however, also possible that the layer or layers are applied on the sacrificial and/or adhesive layer without strain and are only strained by the partial or complete removal of the sacrificial layer and/or during the modification of the adhesive layer of the layer stack, and thus change their shape and roll up, for example.

If the layer or the layer stack is applied on the substrate in a strained state, advantageously in a differentially strained manner, the strain is released, for example by partial or complete removal of the sacrificial and/or adhesive layer or by modification of the sacrificial and/or adhesive layer, in a chemical, mechanical, electrical, thermal, optical, magnetic or electromagnetic manner, so that the applied layer or layers detach from the substrate and are deformed, for example, into a helical, tubular (cylindrical), elliptical, hyperbolic, toroidal, wave-like and/or polygonal shape.

Within the scope of the present invention, the modification of the sacrificial and/or adhesive layer on the substrate is to be understood as meaning that the modification of the sacrificial and/or adhesive layer results, after a triggering of the modification for the deformation of the subsequently applied layer or layers, in a helical, tubular (cylindrical), elliptical, hyperbolic, toroidal, wave-like and/or polygonal shape, for example. This can occur, for example, by triggering chemical or physical processes on, in or around the sacrificial and/or adhesive layer, for example, by reaching a temperature at which the sacrificial and/or adhesive layer melts, or by triggering a chemical and/or physical reaction in the sacrificial and/or adhesive layer.

After the application of the at least one sacrificial and/or adhesive layer, at least one layer of a carrier material is applied. These one or more layers of carrier materials can thereby advantageously be produced from and composed of metal, metal compounds, organic metal complexes, ceramic, semiconducting materials and/or polymers. The one or more layers of materials can be applied in a strained state on the sacrificial and/or adhesive layer, or can be strained after the removal and/or modification of the sacrificial and/or adhesive layer, so that the shape thereof changes in each case from the planar shape to a three-dimensional shape.

Multiple layers can also be present as a carrier layer. The individual layers of the carrier material can be present across the entire surface or partially present.

One or more layers of carrier materials are applied in a strained state and/or they are in a state which, when a strain is released, achieves a deformation into a three-dimensional state of the layer(s) of the carrier materials and of the layers located thereon. For example, one layer of a carrier material can be a swellable layer that swells up as a result of the dissolution or modification of the sacrificial and/or adhesive layer or as a result of an introduction of a swelling agent, and thus deforms three-dimensionally all layers arranged on the swellable layer.

All layers can be applied using methods known per se, such as CVD, PVD, sputtering, as well as spin coating, spraying, printing technologies (injet printing, flexography, engraving, etc.) doctor blade coating, or casting. The sacrificial and/or adhesive layers can also be applied and structured by means of lithographic methods.

Likewise, all layers can be applied across the full surface on the layer located thereunder or substrate, or only partially and also in a structured or unstructured manner.

On the at least one carrier layer, at least one layer or multiple layers of a material system are then applied which are used to produce one or more elements for the measurement and/or generation of vector fields in at least one direction.

The layer or layers of the material systems can also be applied in a strained state on the carrier layer, or in the case of a non-complete surface application of the carrier layer, also directly on the sacrificial and/or adhesive layer, or they can be strained after the removal and/or modification of the sacrificial and/or adhesive layer, so that in each case the shape thereof also changes from the planar shape to a three-dimensional shape.

One or more layers of the material systems are applied which are advantageously applied for the production of contacts, Hall sensors, GMR sensors, TMR sensors, AMR sensors, MR sensors, sensors, GMI sensors, spin valves, magnetic coils, antennas, optical sensors and/or sources, mechanical tension and/or pressure sensors, thermal sensors, acoustic sensors, capacitors, transistors, diodes and/or resistors. The material composition, arrangement, dimensions, structures are selected and applied on the carrier layer(s) depending on the element desired.

According to the invention it is thereby particularly important that, in the arrangement of the desired elements on the carrier layer, the position on the carrier layer is specifically selected so that, after the production of the three-dimensional component, the respective element is located in the desired three-dimensional position.

This is the particular advantage of the production method according to the invention, that the production of the elements can be achieved in a planar design with known and simple and cost-effective technologies, and very complex components in a three-dimensional orientation are thus attainable with a simple, suitably technologically manageable method.

In the production of the elements by means of an application of one or more layers on the carrier layer, it must also be taken into account that layers of electrically conductive material for electrical contacts are also applied for the supply of power to the element(s). However, this is only necessary for those elements that must be supplied with electric current, such as sensors, capacitors, etc. Elements such as magnets, for example, do not require an individual power supply, so that separate contacts for the supply of power do not need to be present. Elements of this type as well as other elements on the carrier layer(s) are and/or can be connected in an electrically conductive manner to other components on the carrier layer(s). Layers for contacts of this type must also be applied according to the invention.

The electrical contacts are advantageously conductor tracks 012 and 112 made of an at least partially electrically conductive material, such as copper, gold, conductive polymers, semiconductors or oxides.

After all layers necessary for the desired elements and the supply thereof have been applied in a planar orientation on the carrier layer(s) or, in the case of non-complete application of the carrier layer on the sacrificial and/or adhesive layer, also partially directly on the sacrificial and/or adhesive layer, the sacrificial or adhesive layer is partially or completely detached or modified. In this manner, either the strain of the strained and/or modified layer or layers on the sacrificial and/or adhesive layer is released, or the straining of the layer or layers on the sacrificial and/or adhesive layer is triggered. Thus, in each case, a deformation of the layer or layers into a three-dimensional shape is achieved and at the same time an at least partial detachment of the layer or layers from the sacrificial and/or adhesive layer and/or the substrate. This deformed layer stack, which is thus three-dimensional after being formed out of the planar plane, is the three-dimensional component according to the invention.

Other additional method steps can subsequently be carried out, for example the removal of the three-dimensional component from the substrate and positioning in another location and/or on another substrate as an array, for example.

With the method according to the invention, multiple identically designed components and or components that are different in terms of their construction and function can also be simultaneously produced on a substrate.

With the method according to the invention, the component according to the invention can also be achieved in which at least one element made of material systems, such as any of elements 001-008 and 101-108, depicted in FIGS. 1 and 2, respectively, is present on a three-dimensional carrier made of at least one carrier material, which element measures and/or generates at least one vector field in at least one direction in the spatial position of the element on, against and/or in the carrier. Schematically shown as element 014 in FIG. 1 is a component of materials systems in the form of a coil.

According to the invention, it is thereby particularly important for the element(s) to be located in a spatial position on, against and/or in the carrier that is different from the production position.

As carrier materials metals, metal compounds, organic metal complexes, ceramics, semiconducting materials and/or polymers can advantageously form the three-dimensional carrier.

The carrier can be present in different three-dimensional shapes, for example, in a helical, tubular/cylindrical (see FIG. 1, 013, e.g.), elliptical, hyperbolic, toroidal, wave-like and/or polygonal (see FIG. 2, 113, e.g.) shape.

According to the invention, at every spatial point of the three-dimensional carrier, there can be one element for which the measuring and/or generating direction in the vector field can be identical and/or different.

Contacts, Hall sensors, GMR sensors, TMR sensors, AMR sensors, MR sensors, MI sensors, GMI sensors, spin valves, magnetic coils, antennas, optical sensors and/or sources, mechanical tension and/or pressure sensors, thermal sensors, acoustic sensors, capacitors, transistors, diodes and/or resistors can be present as elements.

In the component according to the invention, at least one element is present against, on and/or in the carrier. There can also be two, three, 10, 100, 1000 elements or more against, on and/or in the carrier.

The dimensions of the components according to the invention are advantageously on the millimeter, micrometer and/or nanometer scale, and the three-dimensional carrier can have a width of at least 0.1 mm and a length of at least OA mm in length and a wall thickness of at least 10 nm.

With the component according to the invention, vector fields of the most varying physical magnitudes can be measured and/or generated. For this purpose, the components according to the invention must be produced and positioned with the corresponding elements for the measurement and/or generation of the desired vector field in the desired quantity and direction depending on the application requirements.

Likewise advantageously, the three-dimensional components according to the invention are arranged with respectively one concurrent direction of the element on the carrier and/or substrate. According to the prior art, three-dimensional components are, on the one hand, known which themselves are components for the measurement and/or generation of vectors, wherein the measurement and/or generation of vectors can, however, only ever occur in one direction and only ever in the axial direction of the entire component (D. Kamaushenko et al.: Advanced Materials 27, p. 6582-6589, 2015); or on the other hand, two-dimensional and also three-dimensional components are known with which measurements can be performed individually or simultaneously in one or two or three directions of a vector field (Wouters et al: Sensors and Actuators A 237 (2016) 62-71). In the case of measurements of two or three directions at the same time, only directions positioned orthogonally to one another can be measured. One measuring element must be present for each measuring direction.

By contrast, on the one hand according to the invention three spatial directions of a vector field can also be measured simultaneously even if only one or two or three elements are present on, against or in the carrier, but measurements can be performed, also simultaneously or consecutively, by each individual element in other additional directions that are not solely axially oriented or not positioned orthogonally to the other spatial directions.

It is thus particularly advantageous that, depending on the number and position and type of the elements on, against and/or in the carrier, any desired number of vector fields, any desired number of vector field directions and any desired variety of vector fields can be measured and/or generated simultaneously and/or consecutively, using one and the same component according to the invention.

The component according to the invention can advantageously be produced by means of the method according to the invention and is very adaptable to different applications due to the variability of the component in terms of the arrangement of the elements and the variability with regard to the shape and function of the elements.

For example, magnetic flux density, also referred to as magnetic induction, sometimes simply "flux density" or "magnetic field" in colloquial speech, which is the surface density of the magnetic flux that perpendicularly passes through a defined surface element, can be measured with the component according to the invention. The magnetic field strength $\vec{H}$ or flux density $\vec{B}$ is—similar to the electrical field strength $\vec{E}$ or flux density $\vec{D}$—a directed quantity, that is, a vector. (Wikipedia, German-language keyword "magnetische Flussdichte")

With the present three-dimensional component according to the invention for the uni-, bi-, tri- or multi-directional measurement and/or generation of vector fields, in particular the direction, but also the magnitude and/or the gradient for different vector fields, for example, magnetic or electromagnetic variables, pressure and tensile loads, mechanical stress, or temperature can be simultaneously and/or consecutively measured, and advantageously also changed, in one and/or more directions and/or gradients.

With the present three-dimensional component according to the invention for the uni-, bi-, tri- or multi-directional measurement and/or generation of vector fields, constant or dynamic magnetic fields can advantageously be measured in relation to a direction (vector) and magnitude (scalar), wherein the magnetic fields can be reliably, and advantageously simultaneously, measured in all three dimensions and with a small design. According to the invention, the direction of the magnetic flux density thereby takes precedence over the magnitude thereof.

With the present three-dimensional component according to the invention for the multi-directional measurement and/or generation of vector fields, the temperature, mechanical tensile or pressure loads, mechanical stress or the temperature gradient can advantageously be measured, and advantageously also modified.

Also advantageously, with an array, that is, a plurality of three-dimensional components according to the invention on a substrate, the localization of the position of objects in three-dimensional space can be achieved, such as the imaging of ionic, magnetic, metallic and/or current-carrying objects.

Furthermore, the three-dimensional component according to the invention can be used for the measurement of the magnetic flux density, such as in an electronic compass or encoders or electromagnetic radiation in directional antennas, for example.

Advantageously, with the components according to the invention, the measurement of two physical measurands as a function of one another is possible, for example, the measurement of the magnetic field as a function of the temperature.

If the component according to the invention performs the measurement based on the Hall effect, the Hail voltage is measured. In the case of measurement based on the magnetic impedance effect, the electrical resistance is measured.

The magnetic impedance effect describes the change in the complex resistance of a magnetic material when a magnetic field is applied. The magnetic impedance effect thereby includes all magnetoresistive effects, such as the anisotropic magnetoresistive AMR effect, the giant magnetoresistive GMR effect, the tunnel magnetoresistive TMR effect, the extraordinary magnetoresistance MR, the anomalous Hall and magnetic resistance MR, and the giant magnetoimpedance GMI effect.

A magnetic, electrical, electromagnetic, thermal or mechanical vector field can be understood as a vector field according to the invention.

With the solution according to the invention, another difference from the solutions from the prior art is that vector fields can also be generated with the component according to the invention, both uni-, bi-, tri- or multi-directionally and also consecutively and/or simultaneously.

Through a specific positioning and selection of the direction of each individual element for the application on the carrier layer, the spatial position and direction of the element after the deformation of the carrier layer can be specifically determined and produced. The direction for the measurement and/or generation is thereby also specifically brought into a defined spatial position and modified.

In addition to the advantage of the small footprint of the components according to the invention, there are other advantages of the solution according to the invention in terms of the flexibility of production. The known pick-and-place method is time-intensive and, according to the invention, is not used.

Additionally, the shape of the components according to the invention can be adapted to the specific application. The components according to the invention can thus be integrated without a problem in industrially used electronic apparatuses and machines that already exist and are known, such as mobile phones, laptops, etc., and can be adapted to the existing dimensions.

The invention is explained below in greater detail with the aid of several exemplary embodiments.

Example 1

A substrate of silicon dioxide with the dimensions of $100\times100$ mm$^2$ and a thickness of 1 mm is immersed for 5 min in acetone and isopropyl alcohol, subjected to an ultrasound treatment, and subsequently rinsed in deionized (DI) water. The substrate is subsequently subjected to an ultrasound treatment in a 2% aqueous solution of an Alconox detergent (Alconox, Inc.) for 30 min and thoroughly ultrasonically rinsed with deionized water. After the cleaning, the substrate is left in DI water in order to protect the surface against contamination and hydrolysis.

On the substrate surface, a monolayer of 3-(trimethoxysilyl)propyl methacrylate (Polysciences Europe GmbH) is applied as an adhesive layer across the entire surface, in that the substrate was immersed for 20 min within a 1.5 vol % mixture of silane in toluene (Sigma-Aldrich Co. LLC, Germany) and the adhesive layer produced was thus produced and modified. The coated is subsequently washed in toluene, dried with nitrogen gas, and dried at 120° C. on a hot plate for 20 min under a nitrogen atmosphere.

On this adhesive layer, a structured layer of acrylic acid (AA) (Alfa. Aesar) and hydrated LaCl3 (Alfa Aesar) is applied in a rectangular shape across the entire surface as a sacrificial layer. For this purpose, a mixture of 10 g AA and 4.86 g LaCl3 in water is produced, which mixture results in a precipitate of LaAA at a higher solution pH of 10. This precipitate is collected through filter paper in a desiccator, where the precipitate is dried at 40° C. for 10 hours. Next, the material obtained is dissolved in AA and, at a concentration of 25 wt %, photosensitized with 2 wt % 2-benzyl-2-(dimethylamino)-4'-morpholinobutyrophenone and 3 wt % methyldiethanolamine (Sigma-Aldrich Co. Co. LLC, Germany), A 160-nm thick layer is produced by means of spin coating this sacrificial layer at 3000 rpm for 35 s. Drying is carried out at 35° C. for 2 min, and the structuring then occurs by means of a treatment with a 405 nm mercury h-line (20 mW/cm2) for 15 s through a glass/Cr mask with the use of a SUSS MA4 (Karl Suss KG—GmbH & Co., Munich-Garching, Germany) mask aligner. Development takes place in DI water for 5 s with a subsequent rinsing in 1-methoxy-2-propyl acetate (Sigma-Aldrich Co. LLC, Germany). Finally, the samples are annealed at 200° C. for 5 min under a nitrogen atmosphere in order to remove all residual solvent.

A multi-layer carrier layer is applied on the adhesive layer.

First, a rectangular polymeric swelling layer is applied on the sacrificial layer across the entire surface, which layer is produced from a reaction of N-(2-hydroxyethyl)acrylamide (HEAA) and polyethylene-alt-maleic anhydride) (PEMA) in N,N-dimethylacetamide (DMAc), wherein 2 wt % 2-benzyl-2-(dimethylamino)-4'-morpholinobutyrophenone is dissolved in DMAc. 6 g PEMA is dissolved in 50 DMAc and 5.75 g HEAA is added. The reaction takes place for 10 h at room temperature. Using spin-coating, the solution is applied to the sacrificial layer at 4000-8000 rpm; the thickness of the resulting swelling layer is 1000-300 nm. After the polymeric swelling layer is dried at 50° C. for 5 min, the layer stack is exposed on the substrate for 1.5 min to a 405-nm mercury h-line (20 mW/cm$^2$) through a glass/Cr mask with the use of a SUSS MA4 (Karl Suss KG—GmbH & Co., Munich-Garching, Germany) mask aligner.

Development of the mixture is carried out in one part by volume DMAc and 2 parts by volume propylene carbonate (Sigma-Aldrich Co, LLC, Germany) for 30 s with a subsequent rinsing in isopropyl alcohol. Finally, the layer stack is annealed on the substrate at 200° C. for 5 min under nitrogen atmosphere in order to remove excess solvents.

The differential strain is achieved in the swelling layer (hydrogel) by swelling in an aqueous medium. The swelling of the swelling layer is carried out after the entire layer stack has been applied. During the swelling, the sacrificial layer is completely removed. The state of the adhesive layer remains unchanged.

As a second layer of carrier material, a polyimide layer is applied on the swelling layer. The photosensitive polyimide is produced by the reaction of 3,3',4,4'-benzophenonetetra-carboxylic dianhydride (RPDA) and 3,3'-diaminodiphenyl sulfone (DADPS) in N,N-dimethylacetamide (DMAc), photosensitized with (dimethylamino)ethyl methacrylate (DMAEMA) and with 2 wt % 2-benzyl-2-(dimethylamino)-4'-morpholinobutyrophenone (Sigma-Aldrich Co, LLC, Germany). The polyimide synthesis was carried out by dissolving 9.93 g DADPS in 20 mL DMAc with a subsequent addition of 12.8 g BPDA. After the mixture was stirred at 70° C. for 12 h, the solution of polyamide acid (PAA) in DMAc was obtained. The solution of PAA is neutralized by reaction with 12.5 g DMAEMA. Using spin coating, the polyimide was applied on the swelling layer in a rectangular shape across the entire surface as a second carrier layer at 2000-8000 rpm for 35 s. A polyimide layer with a thickness of 1700-500 am is created. After the polyimide layer is dried at 50° C. for 3 min, the sample is exposed for 1.5 min to a 405-nm mercury h-line (20 mW/cm$^2$) through a glass/Cr mask with the use of a SUSS MA4 (Karl Suss KG— GmbH & Co., Munich-Garching, Germany) mask aligner for structuring. Development takes place in a mixture of one part by volume 1-ethyl-2-pyrrolidone, 0.58 parts by volume methyl alcohol and 0.5 parts by volume diethylene glycol monoethyl ether for 1 min with a subsequent rinsing in propylene glycol monomethyl ether acetate (Sigma-Aldrich Co. LLC, Germany). Drying of the polyimide layer is carried out by simultaneously removing the excess solvents on a hot plate at 200° C. for 5 min under a nitrogen atmosphere.

A structured layer stack is then applied on the polyimide layer for the production of 6 sensors made of magnetic materials, composed of Ta(2 nm)/Py(4 nm)/CoFe(1 nm)/Cu (1.8 nm)/CoFe(1 nm)/Py(4 nm)/IrMn(5 nm)/Ta (2 nm) using magnetron sputter deposition in a high-vacuum chamber (base pressure: $4 \times 10^{-7}$ mbar; Ar sputter pressure: $6 \times 10^{-4}$ bar; deposition rate 0.2 Å/s) in the presence of a homogeneous magnetic field of 40 mT for the creation of the magnetic anisotropy, and, as a result of the arrangement on the polyimide layer, is aligned in a direction parallel to the field and at a 45° angle to the self-assembly direction. The layer stack is then completely covered with a 2-nm thick Ta layer in order to improve the adhesion and protect the magnetic stack during the lithographic process.

The electrical contacts to all sensors are produced simultaneously with a Cr(5 nm)/Au(50 nm) double layer via electron beam evaporation (base pressure; $1 \times 10^{-6}$ mbar; deposition rate: 2 Å/s). The width of the contacts is 40 µm. The contacts and sensor elements are structured by means of a UV lithography lift-off method with a lifting-off of the photoresistive layer lying thereunder.

In a single production process, an array of components can be produced across the entire 100×100 mm$^2$ substrate with a quantity of 400 components per sample.

The self-assembly process of the component into a tubular structure is then carried out.

For this purpose, through a selective etching of the sacrificial layer and swelling of the swelling layer in a solution of 0.5 M sodium diethylenetriaminepentaacetate (DTPA) (Alfa Aesar, UK), the previously planar 2D layout is rolled up into a 3D Swiss roll with a positioning of the six magnetic sensors around the axis of the helix (self-assembly. The original orientation of the sensors of 45° in relation to the assembly axis (rolling-up axis) is preserved in the 3D geometry. The relative orientation of the magnetic sensor elements is altered by the rolling-up such that the measuring direction of the sensor elements is aligned at a respective angle of 30°, 45° and 120° to one another.

In this manner, a three-dimensional magnetic component is obtained which measures the field of an external dynamic and static source of a magnetic field, such as an implanted magnet, example, or of electrical or ionic currents in the body of an animal or human.

After the etching process, the structures are washed in DI water and then placed in a solution of DI water and isopropyl alcohol at a ratio of 1:5 for 10 min and finally dried under ambient conditions.

With the three-dimensional component produced in this manner, it is possible to measure the position and the orientation, for example, of implants in heart valves or on the surface of the heart in multiple directions and also simultaneously. The individual component has low space requirements and can simultaneously cover the area previously occupied by a comparable component according to the prior art with multiple components according to the invention. More and different measurements can thus be performed simultaneously.

The production of the three-dimensional component is simple and cost-effective.

Example 2

A sacrificial layer, an adhesive layer, a swelling layer and a second carrier layer are arranged on a substrate according to Example 1.

The swelling layer is thereby arranged in 9 strips and the second carrier layer of polyimide is thereby arranged such that, after the swelling of the swelling layer and the partial detachment of the sacrificial layer, three triangular areas detach from the substrate and, with the fourth triangular layer that remains on the substrate plane, form a three-dimensional component in a tetrahedron shape.

After the application of the polyimide layer, a structured layer of bismuth with a thickness of 50 nm is applied on the polyimide layer in the center of one tetrahedron face each in the form of cross for the production of one Hall sensor each using magnetron sputter deposition in a high-high-vacuum chamber (base pressure: $4 \times 10^{-7}$ mbar; Ar sputter pressure $6 \times 10^{-4}$ bar; deposition 0.2 Å/s).

The self-assembly process of the component into a tetrahedral structure is then carried out.

The original orientation of the capacitors in relation to the assembly axis is preserved in the 3D geometry. The relative orientation of the Hall effect sensors is altered by the three-dimensional shape, so that the measuring direction of the sensors is aligned at an angle of −70° to one another. In this manner, a three-dimensional component is obtained which measures the magnetic field of an external magnet in a mechanical connection of a mechanical prosthesis.

After the etching process, the structures are washed in DI water and then placed in a solution of DI water and isopropyl alcohol at a ratio of 1:5 for 10 min and finally dried under ambient conditions.

With the three-dimensional component produced in this manner, it is possible to measure the position and the orientation of the phalanges of a mechanical prosthesis in multiple directions and simultaneously. The individual component has a low space requirement and can simultaneously cover the area previously occupied by a comparable component according to the prior art with multiple components according to the invention. More and different measurements can thus be performed simultaneously.

The production of the three-dimensional component is simple and cost-effective.

Example 3

On a substrate, a sacrificial layer is applied and a swelling layer in the form of a hydrogel is applied on the sacrificial layer and a second carrier layer of polyimide is applied on the swelling layer according to Example 1. Layers for the production of six magnetic coils of Cr 10 nm/Cu 1000 nm/Cr 10 nm are subsequently applied using magnetron sputter deposition in a high-vacuum chamber (base pressure: $4 \times 10^{-7}$ mbar; Ar sputter pressure: $6 \times 10^{-4}$; deposition rate: 0.2 Å/s).

The electrical contacts are produced with Cr 10 nm/Cu 1000 nm/Cr 10 nm via magnetron sputter deposition in a high-vacuum chamber (base pressure: $4 \times 10^{-7}$ mbar; Ar sputter pressure: $6 \times 10^{-4}$ bar; deposition rate; 0.2 Å/s). The width of the contacts is 40 μm. Each functional layer, including the contacts and elements, is structured by means of a UV lithography lift-off method with a lifting-off of the photoresistive layer lying thereunder.

The self-assembly process of the component into a tubular, cylindrical structure is then carried out. For this purpose, through a selective etching of the sacrificial layer and swelling of the swelling layer in a solution of 0.5 M sodium diethylenetriaminepentaacetate (DTPA) (Alfa Aesar, UK), the previously planar 2D layout is rolled up into a 3D cylinder with a positioning of the magnetic coils on the outer surface of the cylinder (self-assembly). The relative orientation of the six coils in the original 2D position is altered by the rolling-up such that the generating direction of four coils is aligned at an angle of 90° to one another and the generating direction of the other two coils is aligned at an angle of 90° to the first four coils.

With the three-dimensional component produced in such a manner, a constant magnetic field with a defined gradient is generated in a microfluid system in all spatial directions. The individual component has low space requirements and can be used in a microfiuid channel of a microtomograph (MRI) for the generation of gradients of a magnetic field. The production of the three-dimensional component is simple and cost-effective.

The invention claimed is:

1. A method for producing at least one three-dimensional component for the uni-, bi-, tri- or multi-directional measurement or generation of vector fields, said method comprising:

at least one sacrificial or adhesive layer or at least one of both of said layers is applied
to a substrate, and
thereon at least one layer of a carrier layer is applied,
and thereon at least one or more layers of material systems for one or more elements for the measurement or generation of vector fields in at least one direction are completely or partially applied, and lavers of electrically conductive material for electrical contacts of the element(s) are applied,
wherein the layers are applied such that they completely or partially cover an entire surface, and
wherein the arrangement of the one or more layers of material systems for the elements on the carrier layer in a position on the carrier layer is specifically selected so that, after production of the three-dimensional component, the respective element is located in the desired three-dimensional position, and
the sacrificial or adhesive layer or at least one of both of said layers is subsequently at least partially removed from the substrate or modified for detachment from the substrate.

2. The method according to claim 1 in which all of the layers are applied by means of lithographic or printing methods.

3. The method according to claim 1 in which at least one or more layers of material systems for one or more elements for the measurement or generation of vector fields in at least two or three or more directions are applied, and all of the layers of electrically conductive material for electrical contacts of the element(s) are applied.

4. The method according to claim 1 in which a substrate of semiconducting materials, glass, metal, metal compounds, organic metal complexes, Si, Si wafers, polymers, or flexible or stretchable materials, or both of said materials are used.

5. The method according to claim 1 in which a sacrificial or adhesive layer of metal, metal compounds, organic metal complexes, ceramic, semiconducting materials or polymers is used.

6. The method according to claim 1, in which a carrier material made of metal, metal compounds, organic metal complexes, ceramic, semiconducting materials or polymers is used.

7. The method according to claim 1, in which multiple layers of carrier material are used, wherein a layer can advantageously be composed of a swellable layer that can be fully or partially positioned on the sacrificial or adhesive layer.

8. The method according to claim 1 in which layers of material systems for contacts, Hall sensors, GMR sensors, TMR sensors, AMR sensors, MR sensors, MI sensors, GNU sensors, spin valves, magnetic coils, antennas, optical sensors and/or sources, mechanical tension and/or pressure sensors, thermal sensors, acoustic sensors, capacitors, transistors, diodes and/or resistors are applied as elements.

9. The method according to claim 1 in which, from the layer(s) of the carrier material, a three-dimensional carrier is produced in a helical, tubular" cylindrical, elliptical, hyperbolic, toroidal, wave-like or polygonal shape, which carrier forms with the other layers applied thereon the three-dimensional component.

10. A three-dimensional component for the uni-, bi-, tri- or multi-directional measurement or generation of vector fields, in which component:

at least one element made of material systems according to claim 1, on a three-dimensional carrier made of at least one carrier material, said element measures or generates at least one vector field in at least one direction in a spatial position of the element on, against, or, in the carrier.

11. The three-dimensional component according to claim 10 in which metal, metal compounds, organic metal complexes, ceramic, semiconducting materials or polymers are present as carrier material.

12. The three-dimensional component according to claim 10 in which the three-dimensional carrier is present in a helical, tubular, elliptical, hyperbolic, toroidal, wave-like or polygonal shape and, with the other elements located thereon, thereagainst or therein, forms the three-dimensional component.

13. The three-dimensional component according to claim 10 in which conductor tracks or layers of at least partially electrically conductive material, such as metals, conductive polymers, semiconductors or oxides, are present as contacts.

14. The three-dimensional component according to claim 10 in which the element(s) are present in a position against, on or in the carrier that is different from a production position.

15. The three-dimensional component according to claim 10 in which contacts, Hall sensors, GMR sensors, TMR sensors, AMR sensors, MR sensors, MI sensors, CMI sensors, spin valves, magnetic coils, antennas, optical sensors and/or sources, mechanical tension and/or pressure sensors, thermal sensors, acoustic sensors, magnets, capacitors, transistors, diodes and/or resistors are present as elements.

16. The three-dimensional component according to claim 10 in which at least three elements are arranged against, on or in the carrier, wherein the measuring or generating directions of the elements are arranged differently than at 90° to one another.

17. The three-dimensional component according to claim 10 in which at least two elements are arranged against, on or in the carrier, wherein the measuring or generating directions of the elements are differently arranged relative to one another.

18. The three-dimensional component according to claim 10 in which the component has dimensions on the millimeter, micrometer or nanometer scale.

19. The three-dimensional component according to claim 10 in which the carrier has a width of at least 0.1 mm and a length of at least 0.1 mm length and a wall thickness of at least 1 µm.

* * * * *